United States Patent [19]

Brenan et al.

[11] 3,864,820

[45] Feb. 11, 1975

[54] FABRICATION PACKAGES SUITABLE FOR INTEGRATED CIRCUITS

[75] Inventors: Robert R. Brenan, Warren; Thomas D. Bunker, Bradford; David F. Thompson, Warren, all of Pa.

[73] Assignee: GTE Sylvania Incorporated, Stamford, Conn.

[22] Filed: Dec. 14, 1972

[21] Appl. No.: 315,091

Related U.S. Application Data

[63] Continuation of Ser. No. 103,513, Jan. 4, 1971, abandoned.

[52] U.S. Cl. .................................... 29/591, 29/626

[51] Int. Cl. ............................................ B01j 17/00

[58] Field of Search ....... 29/576 S, 626, 630 B, 589, 29/591, 592; 174/DIG. 3; 219/68

[56] References Cited

UNITED STATES PATENTS

| | | | |
|---|---|---|---|
| 3,271,625 | 9/1966 | Caracciolo | 29/576 S |
| 3,404,319 | 10/1968 | Tsuji | 317/234 |
| 3,423,822 | 1/1969 | Davidson | 29/574 |
| 3,544,857 | 12/1970 | Byrne | 29/576 S |

*Primary Examiner*—Roy Lake
*Assistant Examiner*—W. C. Tupman
*Attorney, Agent, or Firm*—Norman J. O'Malley; Donald R. Castle; William H. McNeill

[57] ABSTRACT

An improvement to a process for fabricating packages suitable for use in integrated circuits having a ceramic portion and an electrically conductive portion containing a high density of a plurality of individual component leads and at least one connecting lead wherein the connecting lead extends from a central pad portion through the ceramic portion to a frame portion. The component leads are spaced apart from the central pad portion by a predetermined pattern and extend through the ceramic portion to a frame portion. The ceramic portion, in addition to forming a base for the pad portion and a major segment of the leads, also forms a hermetic seal covering a sizeable segment of the leads. The pad portion, a minor segment of the leads and the frame portion are outside the seal to enable subsequent final assembly. The improvement comprises fabricating the electrically conductive portion having the component leads attached to the central pad forming the ceramic portion and thereafter removing a portion of the component leads to form the predetermined pattern. The improvement enables alignment of the leads to be maintained. A preferred method of removing the pattern is by positioning the package, after the ceramic portion is formed, under a properly shaped electrode and establishing a sufficient potential difference between the electrically conductive portion and the electrode to enable accurate removal of the pattern by electrical discharge machining.

4 Claims, 6 Drawing Figures

INVENTORS.
ROBERT R. BRENAN,
THOMAS D. BUNKER, &
DAVID F. THOMPSON
BY Donald R. Castle
ATTORNEY INVENTORS
ROBERT R. BRENAN,
THOMAS D. BUNKER, &
DAVID F. THOMPSON
BY Donald R. Castle
ATTORNEY

FABRICATION PACKAGES SUITABLE FOR INTEGRATED CIRCUITS

CROSS-REFERENCE TO RELATED APPLICATION

This application is a continuation of Ser. No. 103,513, filed Jan. 4, 1971, now abandoned and assigned to the assignee of the present invention.

BACKGROUND OF THE INVENTION

This invention relates to a method of fabricating articles having a metal-ceramic hermetic seal. More particularly, it relates to a method particularly suitable for fabricating integrated circuit (IC) packages having a relatively high density of leads at the central pad that forms a support bed for a circuit component, normally a semiconductor chip.

Integrated circuit packages having a metal-ceramic hermetic seal are know. The packages heretofore generally consisted of a lead frame that had a frame portion extending around the perimeter thereof and a central pad portion normally having a surface of about 190 mils by 190 mils to form a bed for the component such as a semiconductor chip. A number of leads normally extended from the frame portion toward the pad portion. The center-to-center spacing of the leads at the frame portion is normally either about 50 or 100 mils. In most instances heretofore, the lead frame was fabricated by metal stamping with only one lead connected to the pad and the remaining leads spaced apart from the pad by a predetermined pattern such as about 20 mils. The leads were fabricated such that all four sides of the pad surface were covered, however, the total perimeter of the pad was less than one linear inch. When a relatively small number of leads were required, such as 20 or below, the lead density close to the central pad portion was not high enough to create problems when the lead frame was fabricated by normal metal stamping techniques. The leads at the point adjacent to the pad could have a relatively wide center-to-center spacing, such as above about 20 mils. This created no appreciable problems in stamping the lead frames. Recently, however, there has been an increasing demand for more leads per package. As can be appreciated as the number of leads increased, the width of the leads adjacent to the pad was correspondingly decreased. As this number increased, above about 20, problems occurred in both vertical and horizontal alignment because of distortions caused by mechanical handling and heat distortion during seal fabrication. Maintaining lead alignment during fabrication of the seal became a significant problem.

The intermediate package described herein is not the final package since after the fabrication described herein the IC component is placed in the bed, connected to the component leads and sealed into the unit. The frame portion is removed before its final use. Normally, these later steps are provided by the manufacturing of the IC circuits, rather than by the manufacturer of the intermediate package.

It is believed, therefore, a method of fabricating hermetically sealed intermediate IC packages when there is a relatively high lead density that overcomes lead alignment problems, would be an advancement in the art.

OBJECTS AND SUMMARY OF THE INVENTION

It is an object of this invention to provide a process for manufacturing packages having a metal-ceramic seal where alignment of relatively thin metal parts is required.

It is an additional object of this invention to provide an improved method of fabricating hermetically sealed IC packages having a relatively high lead density.

It is a further object of this invention to provide an extremely efficient and accurate method of removing a predetermined portion of the certain leads after the ceramic portion of the package is formed.

In accordance with one aspect of the present invention, there is provided an improvement to a process for fabricating a package suitable for integrated circuits. The package comprises a ceramic portion that is electrically insulative and an electrical conductive portion comprising a frame portion extending around the perimeter of the package, a central pad portion and a high density of a plurality of individual component leads and at least one connecting lead. The connecting lead extends through the ceramic portion from the pad to the frame. The component leads are spaced apart from the pad by a predetermined pattern and extend through the ceramic portion to the frame. The ceramic portion, in addition to serving as a base for the package, provides a hermetic seal over a major portion of the leads. The frame, the pad and a minor portion of the leads are left exposed for subsequent assembly. The improvement comprises fabricating the electrically conductive portion having the component leads attached to the pad, forming the ceramic portion of the package and thereafter removing the predetermined pattern of component leads to thereby provide the desired spaced apart relationship.

In accordance with a preferred aspect of this invention, the pattern is removed by positioning the component leads under a properly designed electrode and establishing a suitable potential difference between the electric conductive element and the electrode to achieve a suitable electric discharge between electrode and the element to remove a portion of the leads in the form of the desired pattern.

DESCRIPTION OF THE PREFERRED EMBODIMENTS

For a better understanding of the present invention, together with other and further objects, advantages, and capabilities thereof, reference is made to the following disclosure and appended claims in connection with the above-described drawings.

Figure 1:
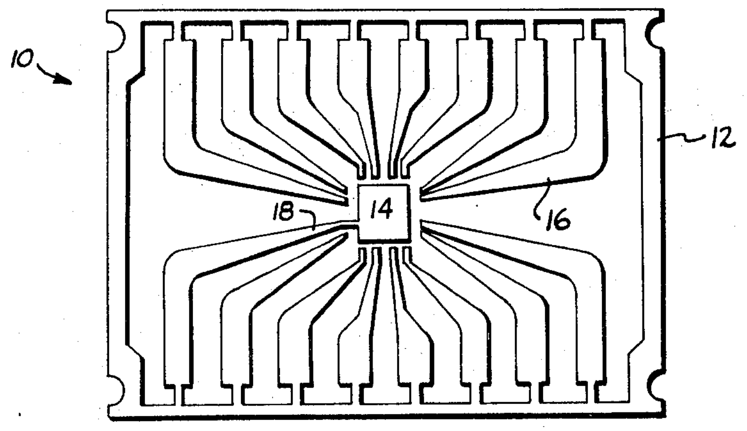
FIG. 1 is a plan view of an electrical conductive element produced by the prior art.

Referring now to the drawings with greater particularity, in FIG. 1 there is shown an electrically conductive metal member made by prior art techniques, designated generally as 10, comprising a frame portion 12 extending around the perimeter, a relatively small central pad portion 14, a plurality of electrically conductive component leads, of which one lead 16 is typical, and a single connecting lead 18 that extends from the central pad 14 to the frame portion 12. When the number of total leads is relatively small, such as sixteen as shown, the leads could be severed from the central pad 14 during fabrication without alignment problems.

Figures 2, 3:
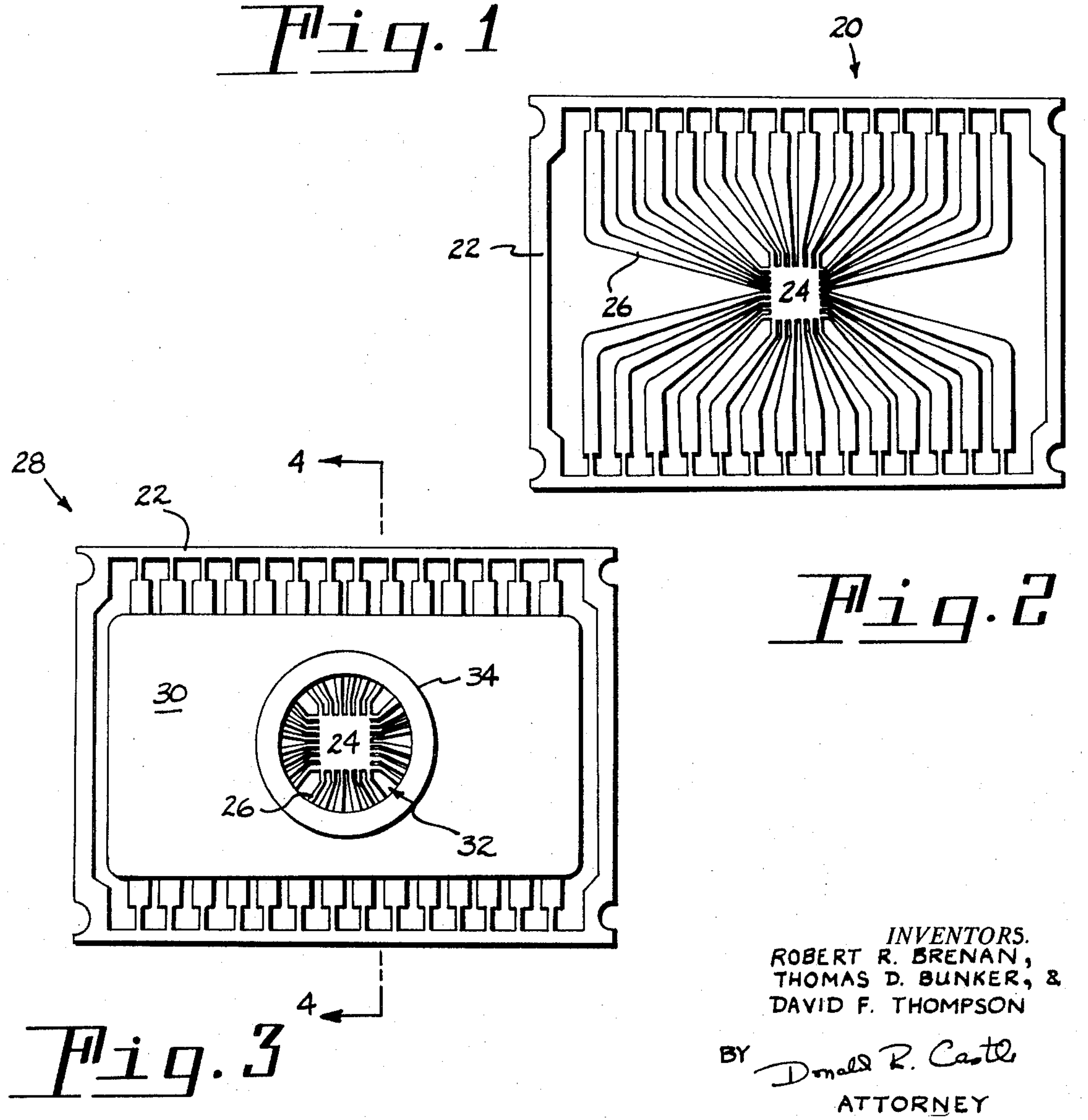
FIG. 2 is a plan view of an electrical conductive element produced in accordance with the subject invention.
FIG. 3 is a plan view of the package of this invention after the ceramic portion has been formed.

In FIG. 2, there is shown an electrically conductive metal member generally designated as 20, fabricated in accordance with the invention which comprises a frame portion 22, a central pad portion 24, a plurality of leads, of which one lead 26 is typical, that extend from the pad portion 24 to the frame portion 22. As the number of leads increase above about twenty such as to twenty-eight as in the member illustrated, the lead density adjacent to the pad portion 24 becomes quite high. If all were severed except one as in the prior art, the leads 26 would not maintain alignment, therefore, they are not severed during fabrication.

With particular reference to FIG. 3, a plan view of a partially completed package, generally designated as 28 is shown. The ceramic portion 30 covers a large segment of the leads 26. A minor portion of the leads adjacent to the central pad portion 24 is not inside the hermetic seal 32. The segment 34 of the ceramic portion extends to the base (not shown) and is physically bound to the rest of the ceramic portion 30. The leads extend to the pad portion 24, through the ceramic portion to the frame portion 22.

Figure 4:
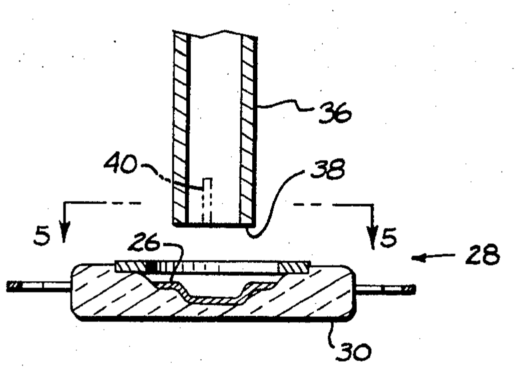
FIG. 4 is a partial elevation view showing a cross section of the shaped electrode and a portion of the package of this invention after the ceramic portion is formed.
Figure 5:
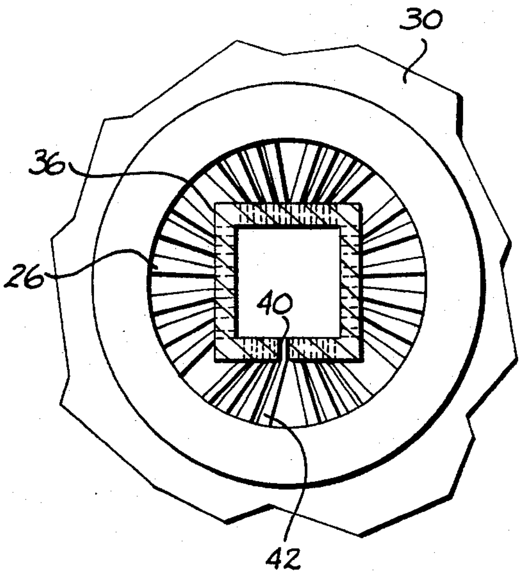
FIG. 5 is a partial plan view of a portion of the package illustrating proper positioning of the electrode.

With particular reference to FIG. 4 and FIG. 5, the shaped electrode 36 is shown in relationship to the package 28 after the ceramic portion 30 is formed. The shaped electrode 36 is formed so that the shape of the tip 38 conforms to the predetermined segment of the component leads 26 that it is desired to remove. A notch 40 is provided in the electrode 36 over connecting lead 42 sufficiently to result in no electrical discharge thereby keeping the connecting lead intact.

Figure 6:
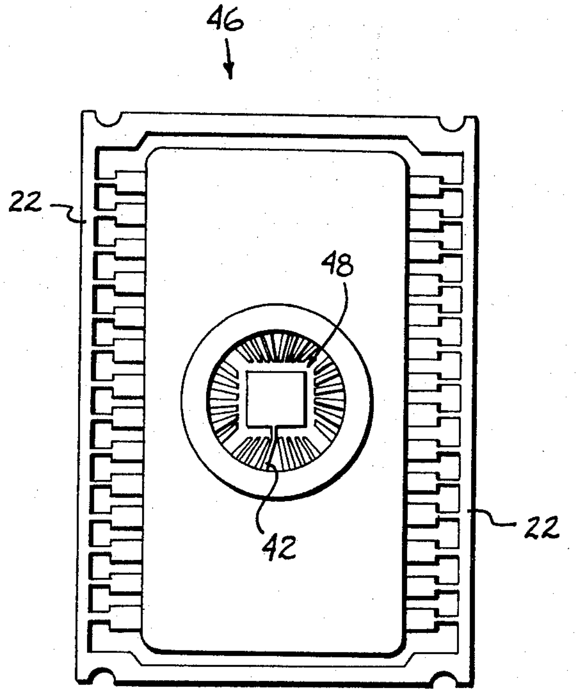
FIG. 6 is a detailed plan view showing the areas that were not etched and constitute the final product of the invention.

With particular reference to FIG. 6, the completed package generally designated as 46 is shown. The portion conforming to the electrode has been removed through electrical dischage machining yielding a pattern 48 as shown. In this manner the connecting lead 42 is in proper relationship and the rest of the leads are in proper alignment enabling an integrated circuit component to be placed upon pad 24. A seal not shown would thereafter be used to seal the component in place and the frame portion 22 is removed.

While there have been shown and described what are at present considered the preferred embodiments of the invention, it will be obvious to those skilled in the art that various changes and modifications may be made therein without departing from the scope of the invention as defined by the appended claims.

What is claimed is:

1. A process for fabricating a package suitable for use in integrated circuits, said process comprising a. fabricating an electrically conductive metal member comprising a frame extending around the perimeter of said member, a central pad and a high density of a plurality of individual leads each being connected to said pad and said frame, said leads comprising a plurality of component leads and at least one connecting lead;

b. molding a ceramic portion that provides a support for said pad, covers and hermetic seals a large segment of each lead without covering and sealing the portions of each lead adjacent to the pad and the frame; and c. removing a predetermined segment of the component leads adjacent to said pad and external to said ceramic without the removal of said ceramic or any portion of said connecting lead adjacent to said pad to establish a predetermined pattern between said pad and one end of said component leads by positioning said predetermined segments under a properly designed electrode and establishing a suitable potential difference between the predetermined segments and said electrode to achieve an electrical discharge between said electrode and said predetermine segments to simultaneously remove said segments and thus produce said desired pattern.

2. An improvement according to claim 1 wherein the number of component leads are greater than 20.

3. An improvement according to claim 1 wherein the center-to-center lead spacing between each individual said component leads is about 50 mils.

4. An improvement according to claim 1 wherein the center-to-center lead spacing between each individual said component leads is about 100 mils.

* * * * *